(12) United States Patent
Ganor et al.

(10) Patent No.: US 7,211,929 B2
(45) Date of Patent: May 1, 2007

(54) MULTILAYER PIEZOELECTRIC MOTOR

(75) Inventors: Ze'ev Ganor, Herzelia (IL); Izhak Rafaeli, Haifa (IL); Lior Shiv, Hillerode (DK); Nir Karasikov, Haifa (IL)

(73) Assignee: Nanomotion Ltd, Yokneam (IL)

( * ) Notice: Subject to any disclaimer, the term of this patent is extended or adjusted under 35 U.S.C. 154(b) by 0 days.

(21) Appl. No.: 11/397,371

(22) Filed: Apr. 4, 2006

(65) Prior Publication Data

US 2006/0175930 A1 Aug. 10, 2006

Related U.S. Application Data

(62) Division of application No. 09/980,375, filed as application No. PCT/IL99/00288 on May 31, 1999, now Pat. No. 7,075,211.

(51) Int. Cl.
*H01L 41/08* (2006.01)

(52) U.S. Cl. ............. 310/317; 310/323.02; 310/323.12

(58) Field of Classification Search ................ 310/317, 310/323.02, 323.12, 323.16, 316, 316.02
See application file for complete search history.

(56) References Cited

U.S. PATENT DOCUMENTS

| | | | |
|---|---|---|---|
| 4,447,753 A | 5/1984 | Ochiai | |
| 4,641,055 A | 2/1987 | Tanaka | |
| 5,039,899 A | 8/1991 | Yamaguchi | |
| 5,136,200 A | 8/1992 | Takizawa et al. | |
| 5,345,137 A | 9/1994 | Funakubo et al. | |
| 5,616,980 A | 4/1997 | Zumeris | |
| 5,646,339 A | 7/1997 | Bayer et al. | |
| 5,696,421 A | 12/1997 | Zumeris et al. | |
| 5,736,911 A | 4/1998 | Watanabe | |
| 5,760,527 A | 6/1998 | Ashizawa | |
| 5,894,185 A | 4/1999 | Asada et al. | |
| 5,949,177 A | 9/1999 | O'Brien et al. | |

(Continued)

FOREIGN PATENT DOCUMENTS

EP 0 313 072 4/1989

(Continued)

OTHER PUBLICATIONS

Mori, K. et al.; "Ultrasonic Linear Motor for a High Precision X-Y Stage"; Oct. 3, 1989; IEEE 1989 Ultrasonic Symposium Proceedings, Canada; pp. 657-660.

(Continued)

*Primary Examiner*—Mark Budd
(74) *Attorney, Agent, or Firm*—Eitan Law Group

(57) ABSTRACT

A method for accelerating or decelerating a moveable body which body is moved by urging a piezoelectric micromotor to the body in a first direction so that a contact region of the piezoelectric motor is pressed to the body and exciting vibrations in the piezoelectric micromotor at the contact region in the first direction and in a second direction along a direction of motion of the body, said vibrations having a first amplitude in the first direction and a second amplitude in the second direction, the method comprising: a) for acceleration, gradually changing a ratio between the second amplitude relative to the first amplitude from substantially zero to a desired non-zero value; or b) for deceleration, gradually changing the ratio between the second amplitude relative to the first amplitude from a non-zero value to substantially zero.

11 Claims, 10 Drawing Sheets

U.S. PATENT DOCUMENTS

| | | |
|---|---|---|
| 6,064,140 A | 5/2000 | Zumeris |
| 6,081,063 A | 6/2000 | Kasuga et al. |
| 6,121,717 A | 9/2000 | Diefenbach et al. |
| 6,218,769 B1 | 4/2001 | Lino et al. |
| 6,252,332 B1 | 6/2001 | Takagi et al. |
| 6,396,194 B1 | 5/2002 | Lino et al. |
| 6,661,153 B1 | 12/2003 | Shiv et al. |
| 6,698,292 B2 | 3/2004 | Kikuchi |
| 6,707,234 B1 | 3/2004 | Kawashima |
| 6,765,335 B2 | 7/2004 | Wischnewskiy |
| 6,806,620 B1 | 10/2004 | Wischnewskiy |
| 2002/0036445 A1 | 3/2002 | Lino et al. |

FOREIGN PATENT DOCUMENTS

| | | |
|---|---|---|
| EP | 0 536 832 | 4/1993 |
| EP | 0 633 616 | 1/1995 |
| EP | 0 755 054 | 1/1997 |
| JP | 55 114015 | 9/1980 |
| JP | 3 265477 | 11/1991 |

OTHER PUBLICATIONS

Nakamura, K et al.; "Speed Control of a Hybrid Transducer-Type Ultrasonic Motor"; Sep. 1994; Transaction of the Institute of Electrical Engineers of Japan; pp. 871-876.

Saigoh, H. et al.; "Multilayer Piezoelectric Motor Using the First Longitudinal and the Second Bending Vibrations;" May 1995; pp. 2760-2764; Japanese Journal of Applied Physics; vol. 34; Part 1; No. 5B.

MULTILAYER PIEZOELECTRIC MOTOR

RELATED APPLICATIONS

The present application is a divisional of U.S. application Ser. No. 09/980,375, which was filed in the U.S. Patent and Trademark Office on Nov. 29, 2001 now U.S. Pat. No. 7,075,211 as a national application of PCT/IL99/00288, filed May 31, 1999.

FIELD OF THE INVENTION

The present invention relates to piezoelectric motors and in particular to multilayer piezoelectric motors formed from layers of piezoelectric material.

BACKGROUND OF THE INVENTION

Piezoelectric micromotors of different shapes and characteristics for driving moveable components of machines are well known in the art. U.S. Pat. No. 5,616,980, which is incorporated herein by reference, describes a piezoelectric micromotor capable of providing a relatively large amount of power for driving a moveable body.

The piezoelectric micromotor comprises a thin rectangular piezoelectric plate having short and long edge surfaces and large parallel face surfaces. One of the large face surfaces has a single large electrode covering substantially all of the area of the face surface. The other large face surface has four "quadrant" electrodes arranged in a checkerboard pattern in which each of the quadrant electrodes covers substantially all of a quadrant of the face surface.

To transmit motion to a moveable body, a region, hereinafter referred to as a "contact region", of a short edge surface of the piezoelectric plate, or a wear resistant extension thereof, is resiliently pressed to a surface area of the body. Voltage differences are applied between quadrant electrodes and the single large electrode, to generate elliptical vibrations in the plate and contact region. Motion is transmitted to the body in directions parallel to the short edges from the contact region of the plate. Typically, to move the body in one direction along the short edge, a same voltage is applied to each quadrant electrode of a first pair of diagonally situated quadrant electrodes. Quadrant electrodes in the second pair of "diagonal" electrodes are floating or grounded. To reverse direction of motion, voltage is applied to the second pair of quadrant electrodes and the first pair is floating or grounded.

Typical operating voltages for the quadrant electrodes range from 30–500 volts and depend upon the geometry of the piezoelectric plate, the mass of the body and a desired speed with which the body is to be moved. Speeds of from 15–350 mm/sec for moveable bodies are reported in the patent for a micromotor having dimensions of 30 mm×7.5 mm×2–5 mm thick. Higher speeds are possible for micromotors of this construction having different dimensions.

In many instances, a piezoelectric micromotor that can provide relatively large amounts of power for driving a moveable body is required to operate as a component in a battery driven device. These devices are generally low voltage devices and it would be advantageous to have piezoelectric micromotors that can provide the power and traveling speeds provided by the piezoelectric micromotor described in the above referenced US patent at lower operating voltages.

Low voltage piezoelectric micromotors are generally formed from a stack of layers of piezoelectric material. Many of these types of "multilayer" micromotors cannot deliver the power and provide the speeds of the described piezoelectric micromotor. In addition, during operation, shear forces often develop in the multilayer micromotor that stress bonds that hold layers of the micromotor together. This occurs especially when the multilayer micromotor accelerates or decelerates a moveable body to which it is coupled. The shear forces tend to damage the bonds and often result in accelerated deterioration of the structure of the micromotor.

A low voltage piezoelectric multilayer micromotor that operates at driving voltages between 3–10 volts is described in an article entitled *Multilayer Piezoelectric Motor Using the First Longitudinal and the Second Bending Vibrations*, by H. Saigoh in Jpn J. Appl. Phys, Vol. 34 (1995) Pt 1, No. 5B pp. 2760–2764. The multilayer micromotor is shaped as a long parallelepiped formed from a stack of 40 thin rectangular layers of piezoelectric material. Voltage differences are applied to electrodes located between the layers to excite elliptical vibration modes in the micromotor. To transmit energy from the vibrations to move a body, the micromotor is pressed to the body so that two contact regions on one of the outer layers in the stack are pressed to the body. Motion is transmitted in either of two directions parallel to the long dimension of the micromotor. The micromotor is reported to move a slider weighing 49 grams at speeds up to 200 mm/s.

U.S. Pat. No. 5,345,137 to Funakubo et al describes multilayer piezoelectric micromotors that comprise a tall stack of thin piezoelectric plates. The height of the stack is substantially greater than its dimensions perpendicular to the height. A contact region for coupling the micromotor to a moveable body is located on a face surface of a top plate in the stack. Motion is transmitted to a moveable element in directions perpendicular to the height. Whereas this type of multilayer micromotor can provide relatively large amounts of power at high speeds, substantial shear forces stress bonds that join plates in the stack.

Because a piezoelectric micromotor is generally required to operate with fast response times and accurately control motion of a body it moves, it is positioned so that a contact region of the micromotor is always pressed to the body. As a result, it is started "under load", i.e. while it is coupled to the body it moves. Therefore, to start the micromotor and initiate motion in the body a large "overshoot starting-voltage" must generally be applied to the micromotor. After motion starts, the applied voltage must be quickly reduced to a substantially lower voltage to maintain a desired speed for the body. The body therefore often begins to move with an uncontrollable lurching. In addition, jitter of as much as a few milliseconds is common in the time at which the body begins to move after the micromotor is turned on.

A problem also sometimes exists when a piezoelectric motor is required to move a body from a first location and position it accurately at a second location. It is generally difficult to control deceleration of the body as it approaches the second location with sufficient accuracy to bring the body directly to the second location so that it is accurately positioned at the second location. Often the body overshoots or undershoots the second location. To accurately position the body, the micromotor is usually operated to "jockey" the body back and forth about the second location until the body is positioned at the second location with a satisfactory degree of accuracy. The jockeying occurs during a period of time, known as a "settling time" that often lasts for as long as several milliseconds to several tens of milliseconds.

It would be desirable to have a high power, low voltage piezoelectric micromotor that provides improved control of motion that it imparts to a body it moves during "start up" and positioning of the body.

SUMMARY OF THE INVENTION

An aspect of some preferred embodiments of the present invention relates to providing an improved high power piezoelectric micromotor that operates at low voltage.

An aspect of some preferred embodiments of the present invention relates to providing a multilayer piezoelectric micromotor in which shear forces that stress bonds adhering layers together in the multilayer micromotor are substantially reduced.

An aspect of some preferred embodiments of the present invention relates to providing a multilayer piezoelectric motor in which at least one of the layers is formed from a non-piezoelectric material.

Aspects of some preferred embodiments of the present invention relate to providing a piezoelectric micromotor that has improved control of the rate at which it transmits energy to a moveable body during start up and positioning of the body.

According to aspects of some preferred embodiments of the present invention a piezoelectric micromotor is provided that is capable of moving a body along either of two orthogonal directions.

An aspect of some proffered embodiments of the present invention relates to providing a method of operating a piezoelectric micromotor that enables improved control of the rate at which energy from the piezoelectric micromotor is transmitted to a moveable body during start up and when bringing the body to rest.

In a preferred embodiment of the present invention, a piezoelectric micromotor comprises a rectangular vibrator having a form of a rectangular parallelepiped. The vibrator is formed from a plurality of thin rectangular layers of piezoelectric material having short and long relatively narrow edge surfaces and relatively large face surfaces. The layers are aligned, stacked one on top of the other perpendicular to their face surfaces and bonded together using methods known in the art. Preferably, adjacent layers in the vibrator are polarized in opposite directions. Preferably, electrodes are located on each face surface of all layers in the vibrator. A contact region for coupling the micromotor to a moveable body is located on an edge surface of the vibrator, preferably formed from short edge surfaces of the layers. This edge surface of the vibrator is, of course, perpendicular to the long dimension of the layers. Preferably, the contact region is a wear resistant "friction nub" bonded to the surface. The location of the contact region, in accordance with a preferred embodiment of the present invention, on an edge surface of the vibrator, is different from the location of contact regions in prior art multilayer motors. Contact regions in prior art multilayer piezoelectric micromotors are located on a large face surface of a top or bottom layer in the stack of layers used to form the micromotor's vibrator.

AC Voltages are applied to electrodes on face surfaces of layers in the vibrator to excite resonant vibrations in the vibrator. Because of the multilayer structure of the vibrator, magnitudes of voltages required to excite resonant vibrations in the vibrator are less than would be required if the vibrator were produced of a single piece of piezoelectric material. Because the contact region is located on an edge of the vibrator perpendicular to the long edges of the layers, the micromotor can deliver relatively large amounts of power for driving a moveable body at relatively high speeds. In addition, because of the location of the contact region, shear forces that act on the vibrator when the micromotor accelerates or decelerates a body, do not stress bonds between piezoelectric layers in the vibrator. A multilayer micromotor in accordance with a preferred embodiment of the present invention is therefore less subject to damage from shear forces than prior art multilayer micromotors.

In some preferred embodiments of the present invention, electrodes are configured on layers of the vibrator so that when the electrodes are electrified in a particular voltage configuration, longitudinal and transverse resonant vibration modes are simultaneously excited in the vibrator. Longitudinal vibrations are parallel to the long dimensions of the layers and transverse vibrations are parallel to the short dimensions of the layers. The longitudinal and transverse vibrations generate elliptical vibrations in the friction nub that are used to transmit motion to a moveable body.

In some preferred embodiments of the present invention electrodes are configured on layers of the vibrator so that when electrodes on some layers are electrified in a particular voltage configuration, substantially only longitudinal vibrations are excited in the layers and thereby in the vibrator as a whole. When electrodes on other layers are electrified in a particular voltage configuration, only transverse vibrations are excited in the layers and thereby in the vibrator as a whole. As a result, longitudinal and transverse resonant vibrations in the vibrator are de-coupled and can be simultaneously and separately controlled.

Independent control of longitudinal and transverse vibrations in the plate, in accordance with a preferred embodiment of the present invention, provides improved control of motion of the friction nub and the rate at which energy is transmitted to a body that the piezoelectric micromotor moves. The improved control can be especially advantageous when the micromotor initiates movement in the body and when it is positioning the body.

For example, at "start-up", when the micromotor is first turned on to accelerate the body, the longitudinal mode is preferably first excited and then the transverse mode is excited, preferably with gradually increasing amplitude. The longitudinal vibration mode couples and uncouples the micromotor to the body. The transverse vibration mode is the mode that transmits energy to and accelerates the body during the periods when the longitudinal mode couples the micromotor to the body. Until the transverse mode is excited there is no load on the micromotor from moving the body. By exciting the transverse mode after the longitudinal mode is excited and gradually increasing the amplitude of the transverse mode, in accordance with a preferred embodiment of the present invention, the load is gradually engaged by the motor. Start up is relatively smooth and the time at which the body begins to move is relatively accurately controllable.

Similarly, the traveling speed at which the micromotor moves the body to a location can be accurately and gradually reduced as the body approaches the location by reducing the amplitude of the transverse vibrations while keeping the amplitude of the longitudinal vibrations substantially constant.

In some preferred embodiments of the present invention, an electrode configuration on the layers and characteristics of the vibrator are provided, such that longitudinal, transverse and bending vibrations in the vibrator can be excited and controlled independently of each other. Bending vibrations are perpendicular to the face surfaces of the layers in the vibrator. Preferably, the vibrator is relatively thin, i.e. the dimension of the vibrator perpendicular to the planes of the layers in the vibrator is relatively small compared to the length and width of the layers. Such a micromotor can provide motion along directions parallel to the short edges of the layers and perpendicular to the face surfaces of the layers. Since longitudinal, transverse and bending vibrations are de-coupled, the micromotor can provide, in accordance with a preferred embodiment of the present invention, improved motion control of a moveable body to which it is coupled in all directions in which the micromotor moves the body.

In some preferred embodiments of the present invention electrodes are configured so that one face surface of each layer in the vibrator has contact with four quadrant electrodes arranged in a checkerboard pattern. Preferably, each quadrant electrode covers substantially all the area of the quadrant with which it is in contact. Preferably, the other face surface of each layer contacts a single large electrode that covers most of the area of the face surface. With this electrode configuration, electrodes can be electrified in voltage configurations that excite and control longitudinal, transverse and bending vibrations in the vibrator independent of each other.

Methods for providing accurate control of energy transfer to a moveable body from a piezoelectric motor by controlling longitudinal, transverse and/or bending vibrations independently of each other, in accordance with preferred embodiments of the present invention, have been described with respect to multilayer motors. However, these methods are applicable to and can be advantageous for operating any piezoelectric micromotor that enables longitudinal vibrations to be controlled independently of transverse and/or bending vibrations.

There is thus provided, in accordance with a preferred embodiment of the invention, a piezoelectric micromotor for moving a moveable element comprising:

a vibrator in the shape of a rectangular parallelepiped formed from a plurality of thin layers of piezoelectric material having first and second identical relatively large rectangular face surfaces defined by long and short edge surfaces wherein the layers are aligned one on top of the other and have their face surfaces bonded together;

electrodes on surfaces of the layers;

a contact region located on one or more edge surfaces of the layers, urged against the body; and a least one electrical power supply that electrifies electrodes to excite vibrations in the vibrator and thereby in the contact region that impart motion to the body.

Preferably, the one or more edge surfaces are short edge surfaces of the layers.

Preferably, the micromotor includes a wear resistant element situated at the contact region for contact with the body.

In a preferred embodiment of the invention, the micromotor comprises electrodes on face surfaces of the layers that are electrifiable by an AC voltage provided by the power supply to excite elliptical vibrations in the vibrator having a controllable eccentricity.

In a preferred embodiment of the invention, the micromotor comprises:

a single large electrode on a first face surface of each layer; and four quadrant electrodes on a second face surface of each layer wherein the quadrant electrodes are arranged in a checkerboard pattern.

In a preferred embodiment of the invention, the micromotor comprises:

a single large electrode on a first face surface of each layer; and a single large electrode on the second face surface of at least one but not all layers;

four quadrant electrodes on the second face surface of at least one layer, wherein the quadrant electrodes are arranged in a checkerboard pattern Preferably, at least two non-contiguous face surfaces have quadrant electrodes.

Preferably, the at least one power supply electrifies all quadrant electrodes on the second face surface of at least one but not all the layers with a same AC voltage so as to excite longitudinal vibrations in the vibrator and thereby in the contact surface wherein longitudinal vibrations are vibrations parallel to the edges of the layers on which the contact region is situated.

In a preferred embodiment of the invention, for at least one layer the at least one power supply electrifies a first pair of diagonally disposed quadrant electrodes with a first AC voltage and a second pair of quadrant electrodes along a second diagonal with a second AC voltage and wherein the first and second AC voltages are 180° out of phase and have a same magnitude, so as to excite transverse vibrations in the piezoelectric vibrator wherein transverse vibrations are vibrations parallel to the edges of the layers on which the contact region is situated. Preferably, the at least one layer comprises a plurality of layers and wherein homologous electrodes on different layers of the plurality of layers are electrified with the same voltage. Preferably, the at least one power source controls magnitudes of AC voltages used to excite longitudinal and transverse vibrations to selectively provide different forms and amplitudes of vibratory motion of the contact region in a plane parallel to the planes of the layers.

Preferably, the at least one power source controls phases of AC voltages used to excite longitudinal and transverse vibrations to selectively provide different forms of vibratory motion of the contact region in a plane parallel to the planes of the layers.

Preferably, the at least one power source controls frequencies of AC voltages used to excite longitudinal and transverse vibrations to selectively provide different forms of vibratory motion of the contact region in a plane parallel to the planes of the layers.

In a preferred embodiment of the invention, for at least one layer the at least one power supply electrifies a first pair of electrodes along a first short edge of the layer and a second pair of quadrant electrodes along a second short edge with first and second AC voltages respectively that are 180° out of phase and have a same magnitude, so as to excite bending vibrations perpendicular to the planes of the layers in the piezoelectric vibrator. Preferably, the at least one layer comprises a plurality of layers. Preferably, homologous electrodes on layers located on a same side of a face surface inside the vibrator are electrified in phase and homologous electrodes on layers located on opposite sides of the face surface are electrified 180° out of phase.

In a preferred embodiment of the invention, the at least one power source controls magnitudes of AC voltages used to excite longitudinal and bending vibrations to selectively provide different forms and amplitudes of vibratory motion of the contact region in a plane perpendicular to the planes of the layers.

Preferably, the at least one power source controls phases of AC voltages used to excite longitudinal and bending vibrations to selectively provide different forms of vibratory motion of the contact region in a plane perpendicular to the planes of the layers.

Preferably, the at least one power source controls frequencies of AC voltages used to excite longitudinal and transverse vibrations to selectively provide different forms of vibratory motion of the contact region in a plane parallel to the planes of the layers.

In a preferred embodiment of the invention, for at least one layer, the at least one power supply electrifies a pair of quadrant electrodes that lie along a first diagonal of the layer with an AC voltage while a pair of quadrant electrodes along a second diagonal of the layer are grounded or floating, in order to excite elliptical vibrations in the vibrator. Preferably, the at least one layer comprises a plurality of layers and wherein homologous electrodes are electrified with the same AC voltage. Preferably, the at least one power supply controls the frequency of the AC voltage to selectively control the eccentricity of the elliptical motion.

In a preferred embodiment of the invention, the micromotor comprises at least one relatively thin layer of non-piezoelectric material having large rectangular face surfaces defined by long and short edges and relatively narrow long and short edge surfaces.

Preferably, the one of the edges of the at least one non-piezoelectric layer are substantially equal in length to one of the corresponding edges of the piezoelectric layers. Preferably, the one edge is a short edge. Preferably, the other edges of the at least one non-piezoelectric layer are slightly longer than the corresponding other edges of the piezoelectric layers so that at least one edge surface of the non-piezoelectric layer protrudes from the piezoelectric layers. Preferably, the other edge is the long edge and wherein at least one short edge surface of the non-piezoelectric layer protrudes from the piezoelectric layers. Preferably, the contact region comprises a region of one of the at least one protruding edge surface.

In a preferred embodiment of the invention, the at least one non-piezoelectric layer is formed from a metal.

In a preferred embodiment of the invention, the power supply is capable of electrifying the electrodes to cause motion in a selectively arbitrary direction in the plane of edge surfaces on which the contact surface is located.

There is further provided, in accordance with a preferred embodiment of the invention, a method for accelerating a moveable body from rest comprising:

(i) urging a piezoelectric micromotor to the body in a first direction so that a contact region of the piezoelectric motor is pressed to the body;

(ii) exciting vibrations in the piezoelectric micromotor, at the contact region, in the first direction while the body is at rest and the piezoelectric motor is not vibrating in the second direction; and (iii) thereafter while the piezoelectric micromotor is vibrating in the first direction at the contact region, gradually increasing the amplitude of vibrations, at the contact region, in a second direction perpendicular to the first direction from zero to a desired maximum amplitude.

Preferably, said vibrations in said first direction are excited by providing a first electrification to at least some first electrodes on the piezoelectric motor and said vibrations in said second direction are excited by providing electrification of at least some second electrodes, at least some of which are different from said first set of electrodes.

In a preferred embodiment of the invention, the piezoelectric motor comprises at least one piezoelectric layer and wherein the first and second electrodes are on the same layer.

Alternatively, the piezoelectric motor comprises a plurality of piezoelectric layers and wherein the first and second electrodes are on different layers.

In a preferred embodiment of the invention, gradually increasing the amplitude of vibrations in the second direction comprises gradually increasing the amplitude of the second electrification.

In a preferred embodiment of the invention, vibrations in the first direction are excited by applying a voltage to the piezoelectric motor within a first frequency range and vibrations in the second direction are excited by applying a voltage to the piezoelectric motor within a second frequency range which partially overlaps the first frequency range. Preferably, performing (ii) comprises applying a voltage at a frequency at which only vibrations in the first direction are excited; and performing (iii) comprises changing the frequency of the voltage to a frequency at which both vibrations in the first and second vibrations are excited.

In a preferred embodiment of the invention, first vibrations in the first and second directions are excited by exciting at least one first electrode and wherein second vibrations in the first and second directions are excited by exciting at least one second electrode, wherein the phase of the vibrations in the second direction has substantially a 180 degree phase difference for the first and second vibrations. Preferably, performing (ii) comprises exciting both said at least one first electrode and said at least one second electrode to cause cancellation of the vibrations in the second direction; and performing (iii) comprises gradually reducing one of the first and second excitations. Preferably, the piezoelectric motor comprises at least one piezoelectric layer and wherein the first and second electrodes are on the same layer. Alternatively, the piezoelectric motor comprises a plurality of piezoelectric layers and wherein the first and second electrodes are on different layers.

There is further provided, in accordance with a preferred embodiment of the invention, a method of decelerating a moving body being moved, by a piezoelectric micromotor to the body in a first direction so that a contact region of the piezoelectric motor is pressed to the body, in a second direction perpendicular to the first direction, said movement being affected by phased vibrations at the contact region in the first and second directions, the method comprising:

gradually reducing the amplitude of vibrations in the second direction while maintaining the vibrations in the first direction; and Preferably, said vibrations in said first direction are excited by providing a first electrification to at least some first electrodes on the piezoelectric motor and said vibrations in said second direction are excited by providing electrification of at least some second electrodes, at least some of which are different from said first set of electrodes. Preferably, gradually decreasing the amplitude of vibrations in the second direction comprises gradually decreasing the amplitude of the second electrification. Preferably, the piezoelectric motor comprises at least one piezoelectric layer and wherein the first and second electrodes are on the same layer. Alternatively, the piezoelectric motor comprises a plurality of piezoelectric layers and wherein the first and second electrodes are on different layers.

In a preferred embodiment of the invention, vibrations in the first direction are excited by applying a voltage to the piezoelectric motor within a first frequency range and vibrations in the second direction are excited by applying a voltage to the piezoelectric motor within a second frequency range which partially overlaps the first frequency range.

Preferably, performing (i) comprises changing the frequency to a frequency at which only vibrations in the first direction are excited.

In a preferred embodiment of the invention, first vibrations in the first and second directions are excited by exciting at least one first electrode and wherein second vibrations in the first and second directions are excited by exciting at least one second electrode, wherein the phase of the vibrations in the second direction has substantially a 180 degree phase difference for the first and second vibrations, wherein said motion is caused by exciting only one of said at least one first and at least one second electrodes. Preferably, performing (i) comprises exciting both said at least one first electrode and said at least one second electrode to cause cancellation of the vibrations in the second direction. Preferably, the piezoelectric motor comprises at least one piezoelectric layer and wherein the first and second electrodes are on the same layer. Alternatively, the piezoelectric motor comprises a plurality of piezoelectric layers and wherein the first and second electrodes are on different layers.

BRIEF DESCRIPTION OF FIGURES

The invention will be more clearly understood by reference to the following description of preferred embodiments thereof, read in conjunction with the figures attached hereto. In the figures, identical structures, elements or parts which appear in more than one figure are labeled with the same numeral in all the figures in which they appear. The figures are listed below and.

DETAILED DESCRIPTION OF PREFERRED EMBODIMENTS

Figure 1A:
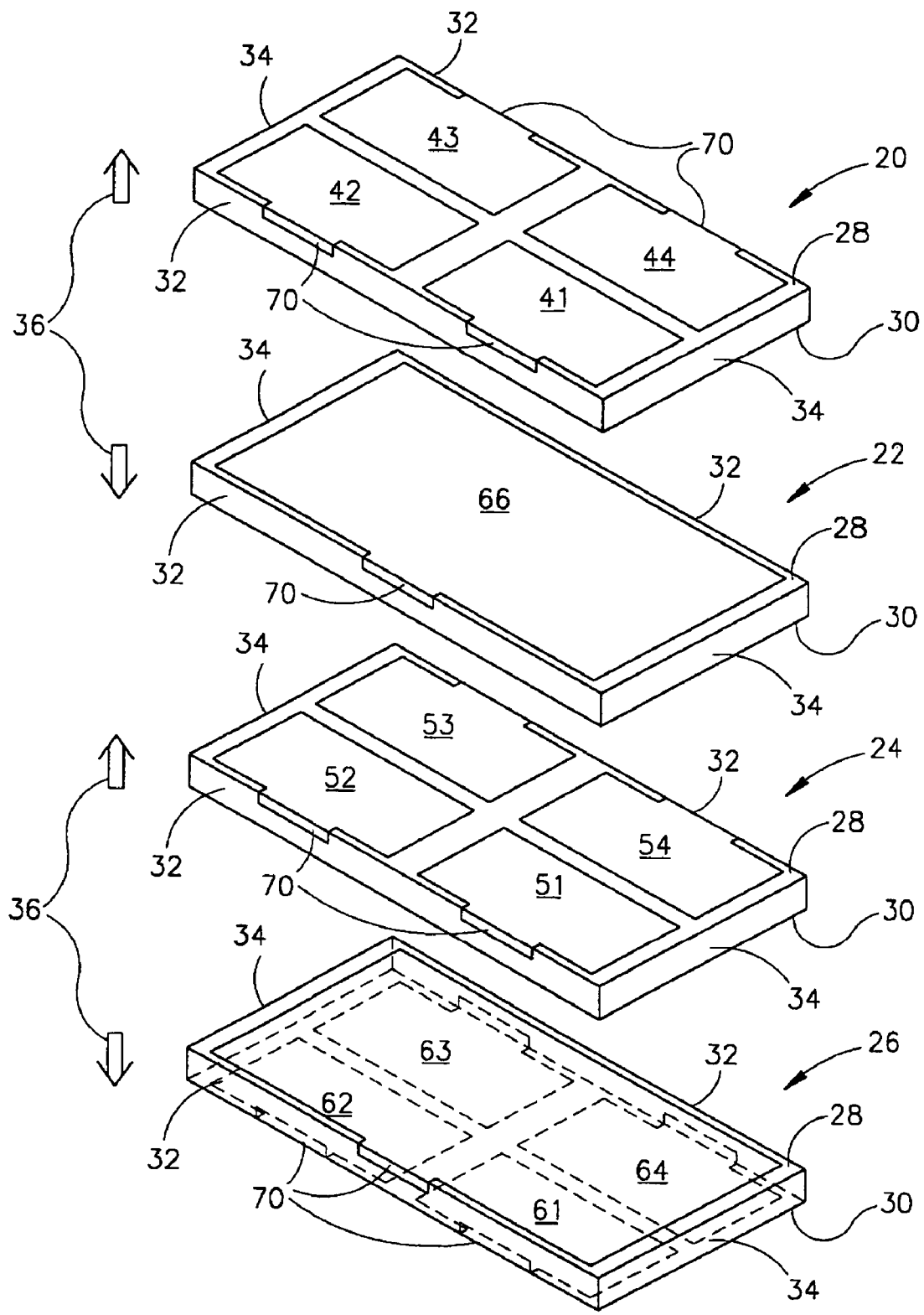
FIGS. 1A and 1B show schematically layers of piezoelectric material used to construct a piezoelectric multilayer micromotor, in accordance with a preferred embodiment of the present invention, and a multilayer micromotor constructed from the layers, respectively.

FIG. 1A shows schematically four thin piezoelectric layers 20, 22, 24 and 26 used to construct a multilayer micromotor, in accordance with a preferred embodiment of the present invention. The dimensions of layers 20, 22, 24 and 26 in FIG. 1A and elements and features shown in FIG. 1A and figures that follow are not necessarily to scale and are chosen for convenience of presentation. Furthermore, the choice of four layers in FIG. 1A is by way of example only and is not intended to imply a limitation of preferred embodiments of the present invention, which can have a number of layers other than four.

Each of layers 20, 22, 24 and 26 has relatively large parallel rectangular top and bottom surfaces 28 and 30 respectively, two narrow long edge surfaces 32 and two short edge surfaces 34. Bottom surface 30, a short edge surface 32 and a long edge surface 34 of each of layers 20, 22, 24 and 26 are hidden in the perspective of FIG. 1. Hidden edges of bottom surface 30 and electrodes on bottom surface 30 are shown in ghost lines for layer 26. Preferably, all layers 20, 22, 24 and 26 have the same dimensions and all are formed from the same piezoelectric material. Preferably, the piezoelectric material in each of layers 20, 22, 24 and 26 is polarized perpendicular to top face surface 28 of the layer. Preferably the polarization directions of any two adjacent layers are opposite to each other. The polarization direction of each of the layers in FIG. 1A is shown by the direction of a double line arrow 36 near the leftmost corner of the layer.

Layer 20 preferably has four quadrant electrodes 41, 42, 43 and 44 formed using methods known in the art on its top surface 28. Similarly, layer 24 preferably has four quadrant electrodes 51, 52, 53 and 54, on its top surface 28. Preferably, layer 26 has four quadrant electrodes 61, 62, 63 and 64, shown in ghost lines, located on its bottom surface 30. Preferably, each of the quadrant electrodes has a contact tab 70 for making electrical contact with the electrode. Contact tab 70 of each electrode extends from the body of the electrode and preferably extends to cover a region of a long edge surface 32 of the layer on which the electrode is located.

Preferably, layer 22 has a single large electrode 66 formed on its top surface 28. Preferably, layer 26 has a single large electrode 68 formed on its top surface 28. Each large electrode 66 and 68 preferably has a contact tab 70 that covers a region of a long edge surface 32 of the layer on which it is located.

Figure 1B:
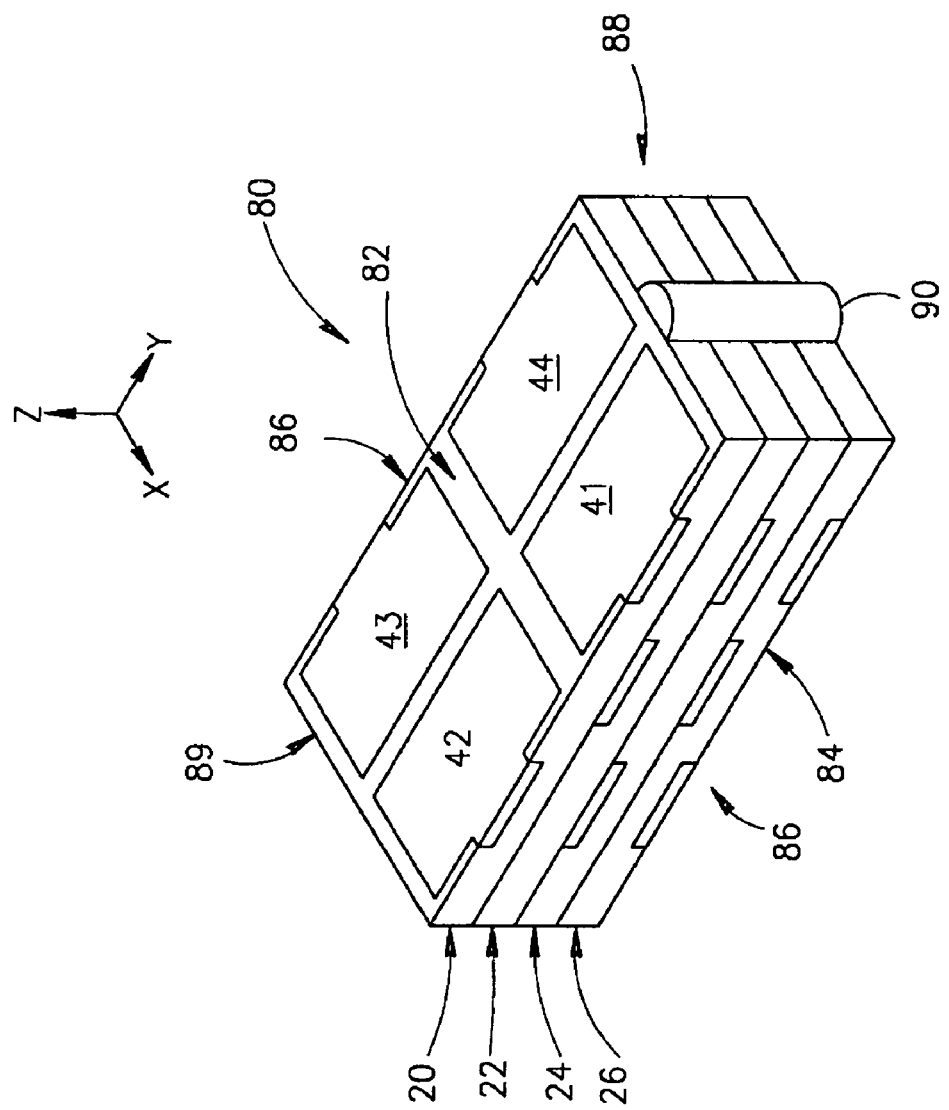

Layers 20, 22, 24 and 26 are aligned and bonded together one on top of the other, in the order in which they are shown in FIG. 1A, using processes known in the art, to form a piezoelectric multilayer micromotor 80 shown in FIG. 1B, in accordance with a preferred embodiment of the present invention.

The dimensions of layers 20, 22, 24 and 26 are such that preferably, piezoelectric micromotor 80 is shaped in the form of a relatively thin rectangular plate. Micromotor 80 has relatively large top and bottom face surfaces 82 and 84 respectively, long edge surfaces 86 and short edge surfaces 88 and 89. In FIG. 1B and FIGS. 2A, 2B and 2D that follow directions are defined with reference to a coordinate system 100 in which the x and y axes are respectively parallel to short and long edge surfaces 88 and 86 and the z-axis is perpendicular to top face surface 82.

Preferably, the dimensions of micromotor 80 and piezoelectric materials from which layers 20, 22, 24 and 26 are formed are chosen so that at least one low order longitudinal and one low order transverse resonant vibration mode of micromotor 80 have at least partially overlapping excitation curves. Preferably, micromotor 80 also has at least one low order resonant bending vibration mode having an excitation curve that overlaps an excitation curve of a low order longitudinal resonant vibration mode. Longitudinal and transverse vibration modes are perpendicular to short edge surfaces 84 and long edge surfaces 86 respectively, (i.e. they are parallel to the y and x-axes respectively). Bending vibration modes are perpendicular to face surfaces 82 and 84 (i.e. parallel to the z-axis).

Preferably, a wear resistant friction nub 90 for coupling micromotor 80 to a body that it moves is bonded to short edge surface 88 using methods known in the art. Transverse and longitudinal vibrations in micromotor 80 cause friction nub 90 to move parallel to the x-axis and y-axis respectively. Bending vibrations cause friction nub 90 to move parallel to the z-axis.

Figure 2A:
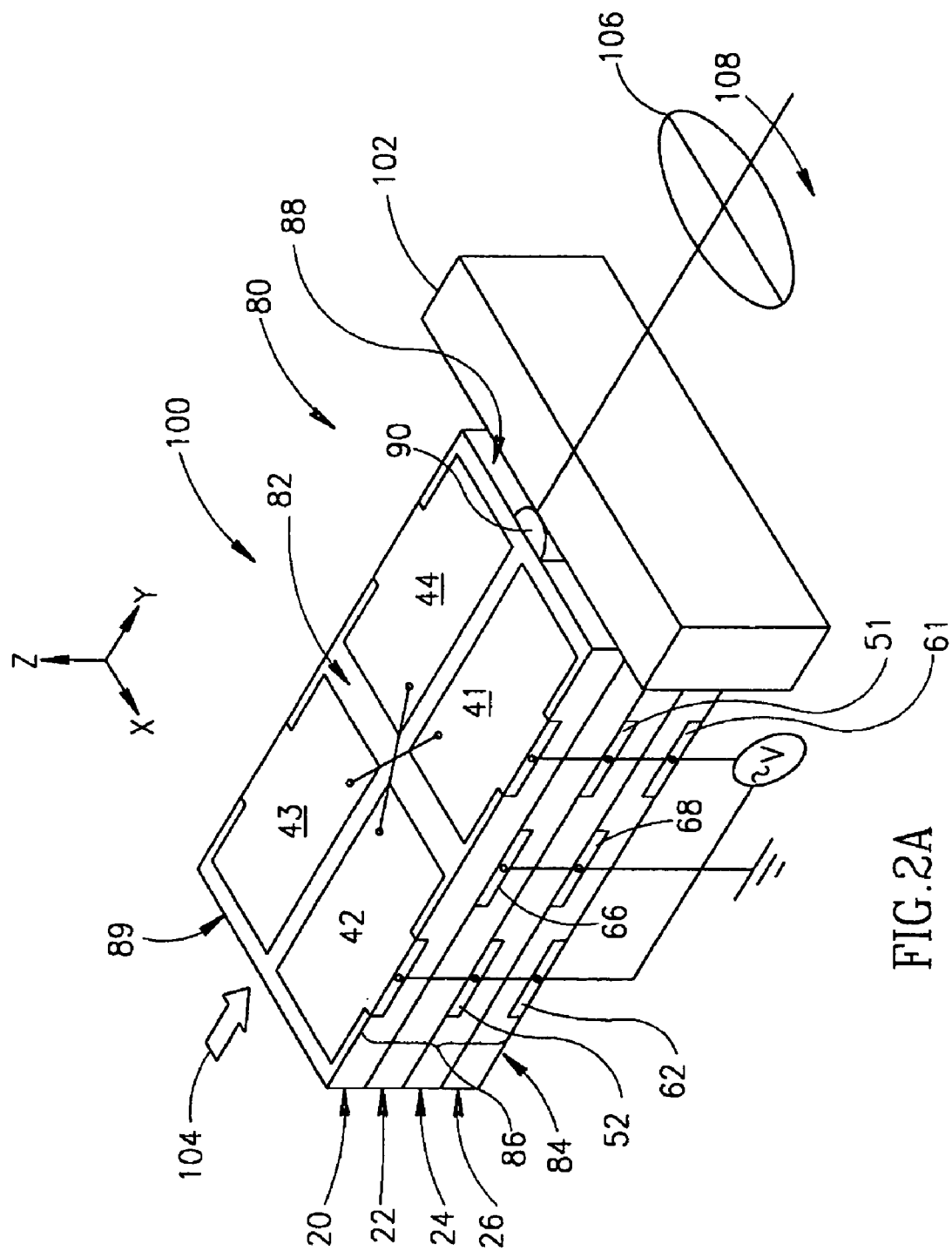
FIGS. 2A–2D show schematically different ways of electrifying electrodes in the micromotor shown in FIG. 1B to generate different vibration modes in the micromotor and how vibrations in the micromotor can be controlled to smoothly accelerate and decelerate a moveable body, in accordance with a preferred embodiment of the present invention.
Figure 2B:
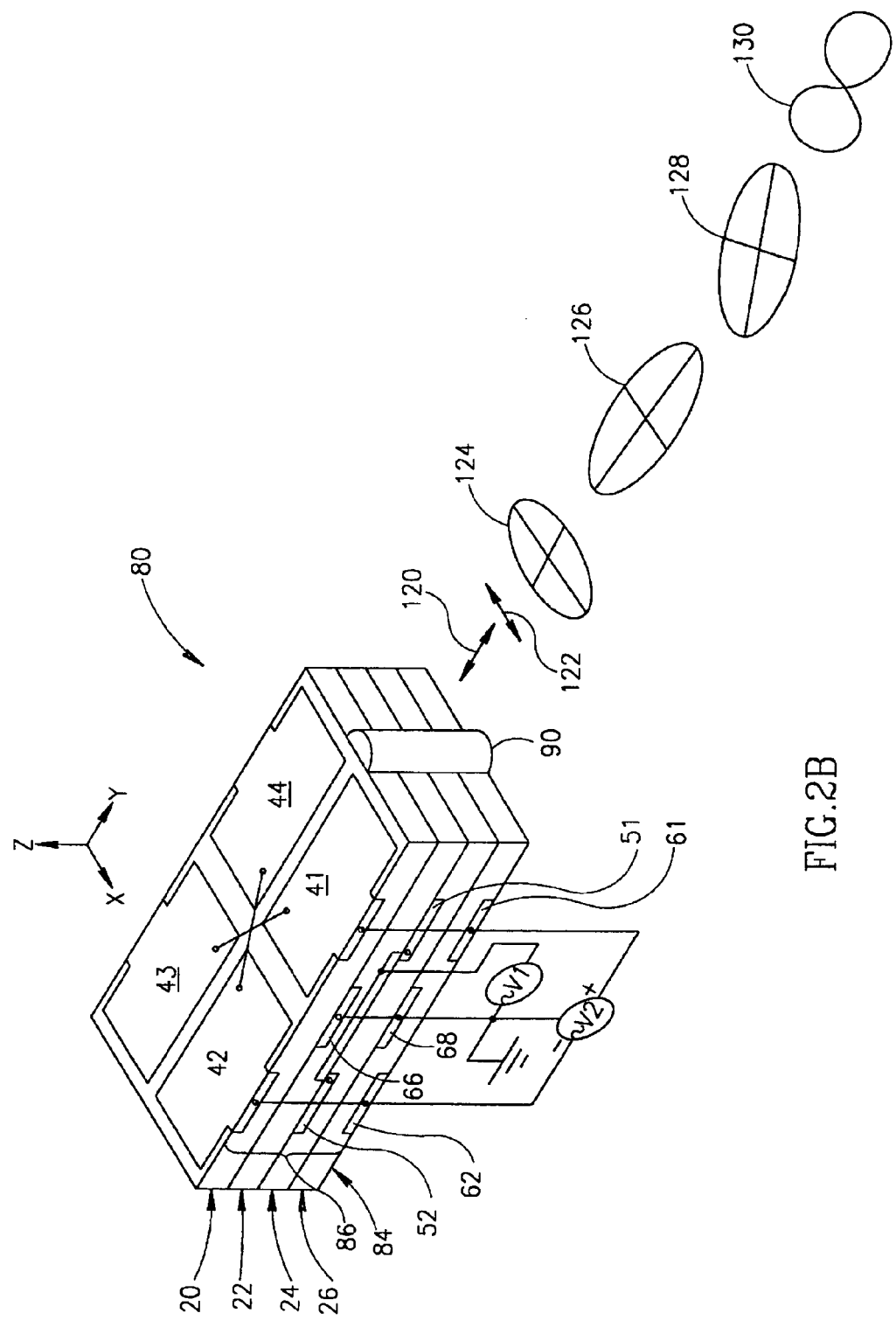
Figure 2C:
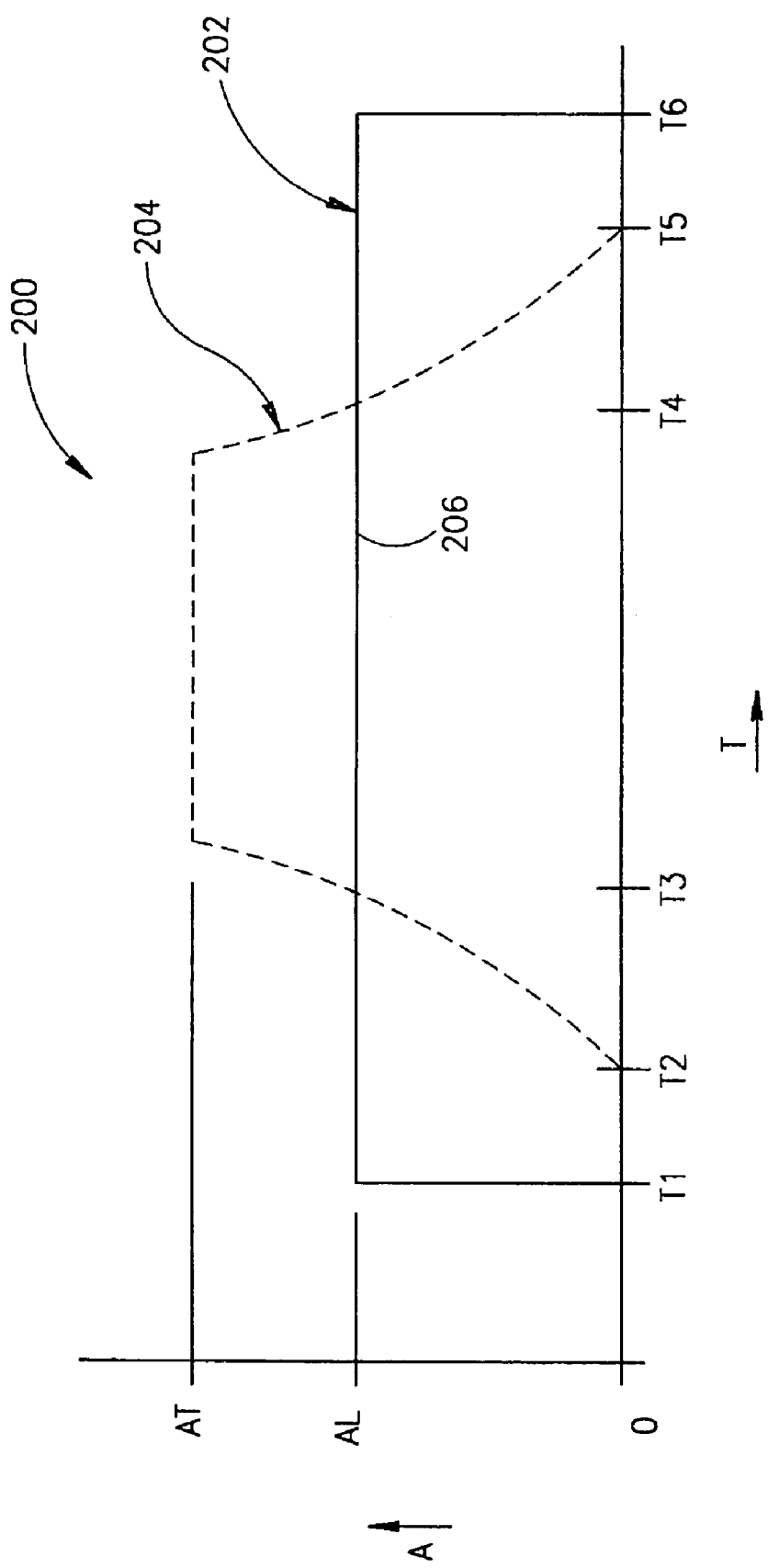

FIGS. 2A–2C illustrate schematically different methods of exciting vibrations in micromotor 80 shown in FIG. 1B, in accordance with preferred embodiments of the present invention.

Contact tabs 70 shown in FIG. 1A are shown in FIGS. 2A–2C labeled with the numerals of the quadrant electrodes of which they are a part for clarity of presentation. Electrical connections between the various electrodes on layers 20, 22, 24 and 26 shown in FIG. 1A are shown in FIGS. 2A–2C by connections between their respective contact tabs, and by connections between quadrant electrodes on top surface 82. In FIGS. 2A–2C only one of long edge surfaces 86 is shown. Electrical connections between contact tabs of electrodes on the long edge surface 86 which is not shown are identical to electrical connections between contact tabs of electrodes on the long edge surface 86 that is shown.

In FIG. 2A micromotor 80 is shown coupled to a moveable body 102. A resilient force represented by arrow 104 presses on short edge surface 89 and urges micromotor 80 towards body 102 so that friction nub 90 contacts body 102. All quadrant electrodes along a same corner of micromotor 80 and along diagonally opposite corners of micromotor 80 are electrically connected together. In FIG. 2A connections between quadrant electrodes 41, 51 and 61 and between 42, 52 and 62 are shown. Connections between quadrant electrode 43 and electrodes 53 and 63 (shown in FIG. 1A) below quadrant electrode 43 and connections between quadrant electrode 44 and quadrant electrodes 54 and 64 (shown in FIG. 1A) below quadrant electrode 44 are not shown. Connections between quadrant electrodes located along diagonally opposite corners of micromotor 80 are shown by diagonal connections between quadrant electrodes 41 and 43 and between quadrant electrodes 42 and 44. The diagonally located quadrant electrodes connected to electrodes 41 and 43 are collectively referred to as "diagonal electrode 41≧43". Similarly, the quadrant electrodes connected to quadrant electrodes 42 and 44 are collectively referred to as "diagonal electrode 42–44". Large electrodes 66 and 68 on layers 24 and 28 are connected and preferably grounded. Large electrodes 66 and 68 are collectively referred to as "ground electrode 66–68".

By applying an AC voltage to diagonal electrode 41–43 and floating or grounding diagonal electrode 42–44, longitudinal and transverse resonant vibrations are simultaneously excited in micromotor 80. In FIG. 2A diagonal electrode 42–44 is shown grounded and diagonal electrode 41–43 is shown connected to an AC voltage source V. The vibrations cause friction nub 90 to execute a counterclockwise elliptical motion in the xy plane that moves body 102 in the positive x direction. An ellipse 106 represents schematically the motion of friction nub 90 and the clockwise direction around ellipse 106 is indicated by the direction of arrow 108. By applying the voltage to diagonal electrode 42–44 and floating or grounding diagonal electrode 41–43, friction nub 90 "travels" ellipse 106 in a clockwise direction (the direction indicated by arrow 108) and body 102 moves in the negative x direction.

The method of operating micromotor 80 shown in FIG. 2A enables micromotor 80 to provide relatively large amounts of power for moving body 102 and to move body 102 at relatively high speeds. Furthermore, voltages required to operate micromotor 80 are substantially less than those that would be required if micromotor 80 were produced from a single piece of piezoelectric material. However, the method of operating micromotor 80 does not enable longitudinal and transverse resonant vibrations in micromotor 80 to be excited and controlled independent of each other. When applying AC voltage to diagonal electrodes 41–43 and 42–44 as described, both longitudinal and transverse vibration modes are simultaneously excited in micromotor 80. For a given frequency of applied AC voltage the ratio of the amplitudes of the longitudinal and transverse vibration modes is substantially constant. Increasing or decreasing the magnitude of the applied voltage respectively increases or decreases the amplitudes of both longitudinal and transverse vibrations.

Since micromotor 80 accelerates and decelerates body 102 along the x axis and layers 20–26 are parallel to the xy plane it is seen that there are no shear forces that stress bonds between layers in micromotor 80. This is unlike in prior art multilayer micromotors in which bodies moved by the micromotors are coupled to surfaces parallel to the layers in the micromotors. In these prior art multilayer micromotors all the shear forces resulting from the inertia of bodies that they move stress bonds between layers in the multilayer micromotors. A multilayer micromotor in accordance with a preferred embodiment of the present invention therefore is less susceptible to damage from shear forces than prior art micromotors.

FIG. 2B illustrates schematically a method of operating micromotor 80 in which longitudinal and transverse vibration modes are controllable independent of each other.

In FIG. 2B all quadrant electrodes 51, 52, 53, and 54 that are located between layers 22 and 24 are preferably electrically connected together (quadrant electrodes 53 and 54 are not shown in FIG. 2B). This in effect produces a single large electrode between layers 22 and 24, hereinafter referred to as "electrode 51–54". Electrode 51–54 is driven by an AC power source V1. When V1 applies an AC voltage to electrode 51–54, electric fields are generated in layers 22 and 24 that excite substantially only longitudinal vibrations (i.e. vibrations in the y direction) in these layers and thereby in micromotor 80. The magnitude of the voltage of V1 controls the amplitude of the longitudinal vibrations.

Quadrant electrodes 41, 43, 61 and 63 (quadrant electrode 63 is not shown) are preferably connected together and are collectively referred to as "diagonal electrode 41–63". Note that diagonal electrode 41–63 in FIG. 2B is different from diagonal electrode 41–43 defined for FIG. 2A. In FIG. 2A diagonal electrode 41–43 includes quadrant electrodes 51 and 53, which are not included in diagonal electrode 41–63 as defined for FIG. 2B. Similarly, quadrant electrodes 42, 44 62 and 64 (not shown) are preferably connected together and collectively referred to as "diagonal electrode 42–64". Diagonal electrode 41–63 and diagonal electrode 42–64 are preferably connected to a balanced AC power source V2 so that they are driven 180° out of phase, as indicated by the "+", "–" and ground signs on power supply V2. When V2 applies voltage to diagonal electrodes 41–43 and 42–44 electric fields are generated in layers 20 and 26. These fields excite substantially only transverse (i.e. y-direction) vibrations in layers 20 and 26 and thereby in micromotor 80. The amplitudes of the transverse vibrations are controlled by the magnitude of V2.

By exciting and controlling longitudinal and transverse vibrations independently of each other, friction nub 90 can be controlled to execute many different forms of motion and these motions can be finely controlled.

For example if only longitudinal vibrations are excited in micromotor 80, friction nub 90 will execute substantially linear vibratory motion along the y-axis, which motion is represented by double arrow line 120. If only transverse vibrations are excited, friction nub 90 will execute substantially linear vibratory motion parallel to the x-axis, which motion is represented by double arrow 122. Elliptical motion of differing eccentricities and orientations can be generated in friction nub 90 by controlling the ratio of the amplitudes of the longitudinal and transverse vibrations and phase differences between them. For example, in an elliptical motion represented by ellipse 124 amplitude of vibration along the x-axis is greater than along the y-axis. In ellipse 126 the situation is reversed and amplitude of motion along the y-axis is much greater than amplitude of motion along the x-axis. In addition the eccentricity of ellipse 126 is different from that of 124. In a motion represented by ellipse 128, which is congruent with ellipse 126, phase between longitudinal and transverse vibrations is adjusted to rotate ellipse 128 with respect to ellipse 126. Major and minor axes are shown for each of the ellipses for ease of visualization.

The previous examples of motion assumed that both the longitudinal and transverse vibration modes have substantially the same frequency. It is also possible to generate more esoteric forms of motion in friction nub 90. For example V2 can apply an AC voltage to excite a transverse vibration mode of micromotor 80 that has a frequency that is twice the frequency of a longitudinal vibration mode excited by V1. The resulting orbit of motion of friction nub 90 is a figure eighth 130.

From the above discussion it is seen that micromotor 80 operated as shown in FIG. 2B, in accordance with a preferred embodiment of the present invention, can be controlled to slowly and smoothly engage a body that it moves. It can also provide improved control of motion of a body that it moves when decelerating the body and bringing it to a stop so that it is accurately positioned at a desired location.

FIG. 2C shows a graph 200 that illustrates schematically an example of how longitudinal and transverse vibrations in micromotor 80 are controlled to smoothly and accurately "start" and "stop" a body that micromotor 80 moves, in accordance with a preferred embodiment of the present invention. In graph 200 the amplitudes of longitudinal and transverse vibrations in micromotor 80 are shown as a function of time as micromotor 80 accelerates a body from rest at a first location and brings it to rest at a second location. Solid line curve 202 graphs the amplitude of the longitudinal vibrations and dashed line curve 204 graphs the amplitude of transverse vibrations.

At time T1 the body is at the first location and electrodes in micromotor 80 are electrified by power source V1 to excite longitudinal vibrations in micromotor 80. In the example illustrated by graph 200 the voltage provided by V1 is controlled to increase to a maximum desired value with a short rise time and remain "plateaued" thereafter for a period of time. Accordingly, the longitudinal vibrations rapidly reach a desired constant operating amplitude "AL", indicated by the height of a plateau 206 in curve 202. At time T1, and as long as only longitudinal vibrations are excited in micromotor 80, motion is not transmitted to the body by micromotor 80, the body does not move and micromotor 80 operates without being loaded by the body.

At a time T2, after the longitudinal vibrations have reached their desired amplitude, power source V2 is turned on to electrify electrodes in micromotor 80 and excite transverse vibrations in micromotor 80. The magnitude of the voltage that V2 applies to the electrodes is preferably increased relatively slowly from zero at T2 to a desired maximum, which is reached at a time T3. The amplitude of the transverse vibrations graphed by curve 204 follows the voltage of V2 and similarly increases relatively slowly from zero at time T2 to a maximum transverse amplitude "AT" time T3.

With the onset of the transverse vibrations at time T2, the body begins to accelerate away from the first location towards the second location. At time T3 the body stops accelerating and moves towards the second location at a constant traveling speed. During periods in which the longitudinal amplitude is constant, the step size with which micromotor 80 transmits motion to the body is controlled by, and is substantially proportional to, the transverse amplitude. As a result, the acceleration of the body between times T2 and T3 is substantially proportional to the time derivative of curve 204 between T2 and T3 and the magnitude of the traveling speed is substantially proportional to AT. The body moves away from the first location with a smooth accurately controlled motion.

At a time T4, the body has reached a position that is close to the second location and the voltage provided by V2 is preferably controlled to begin to decrease relatively slowly so that at a time T5 it is substantially equal to zero. In response, the transverse amplitude decreases from AT to zero between the times T4 and T5. As the transverse amplitude decreases, the step size decreases and the body is slowly and accurately decelerated from its traveling speed so that at time T5 it is substantially stationary and located at the second location. Following the positioning of the body at the second location the longitudinal voltage provided by V1 is preferably decreased to zero so that at a time T6 the longitudinal vibrations have stopped.

In the above described example of a preferred embodiment of the present invention, the rate of acceleration and deceleration of the body moved by micromotor 80 is controlled substantially only by the transverse vibrations. However, the amplitude of the longitudinal vibrations can be used to control the length of time that micromotor 80 is coupled to the body during each longitudinal vibration cycle. As a result, the amplitude of the longitudinal vibrations as well as the amplitude of the transverse vibrations can be used to control the step size of the micromotor and thereby the acceleration and deceleration of the body. Therefore, in some preferred embodiments of the present invention both longitudinal and transverse vibrations are varied with time during start-up and stopping to provide accurate control of motion transmitted by micromotor 80 to a moveable body.

For example, in "starting" a body, in accordance with a preferred embodiment of the present invention, the longitudinal vibrations may be turned on and their amplitude increased to an operating amplitude at a moderate rate instead of substantially instantaneously as shown in FIG. 3C. If transverse vibrations are turned on and increased while the longitudinal vibrations are increasing, the step size of micromotor 80, and thereby the acceleration of the body, will be controlled by the rates of increase of both longitudinal and transverse vibrations.

Other scenarios for controlling longitudinal and transverse vibrations to provide accurately controlled motion, in accordance with a preferred embodiment of the present invention, and variations in the described scenarios are possible and can be advantageous. These variations and other scenarios will occur to persons of skill in the art.

Figure 2D:
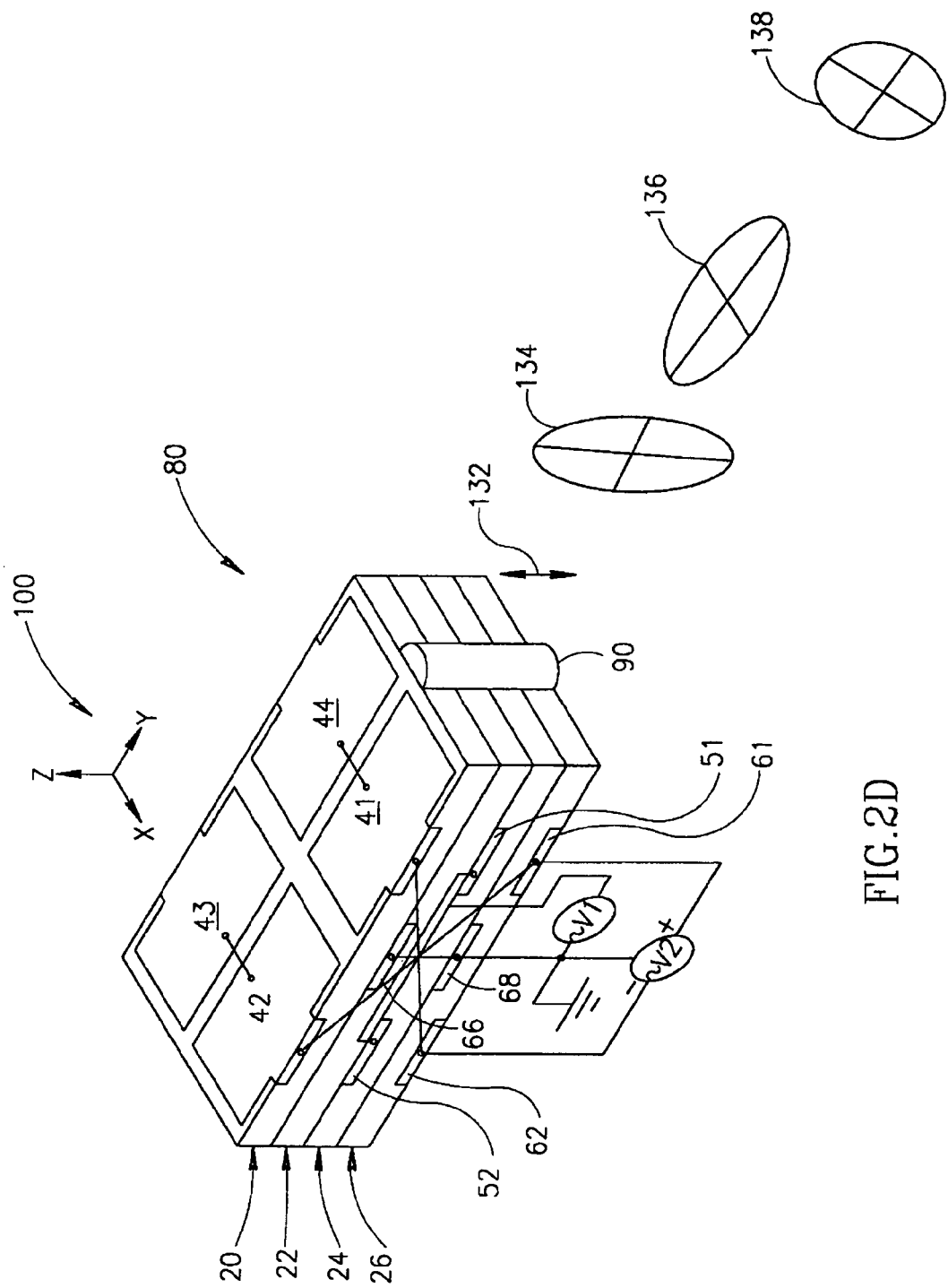

FIG. 2D illustrates schematically a method of operating micromotor 80 that is used to excite and control longitudinal and bending vibrations in micromotor 80 independently of each other.

As in FIG. 2B, large electrodes 66 and 68 in FIG. 2C are connected and grounded and quadrant electrodes 51, 52, 53 (not shown) and 54 (not shown) are connected together to form electrode 51–54. Electrode 51–54 is connected to an AC power supply V1 and used to excite longitudinal vibrations in micromotor 80. Quadrant electrodes 41, 44 on layer 20 and quadrant electrodes 62 and 63 (quadrant electrode 63 is not shown and is located on layer 26 below quadrant 43) are connected. These electrodes are referred to collectively as "cross electrode 41–62". Similarly quadrant electrodes 42, 43, 61 and 64 (not shown and below electrode 44) are connected together and referred to collectively as cross "electrode 42–61".

Cross electrodes 41–62 and 42–61 are connected to an AC power source V2 and driven 180° out of phase. As a result, when material in layer 20 below quadrant electrodes 41 and 44 contract, material in layer 20 below quadrant electrodes 42 and 43 expand, material in layer 26 above quadrant electrodes 61 and 64 (below electrodes 41 and 44) expand and material in layer 26 above quadrant electrodes 62 and 63 (below electrodes 42 and 43) contract. The contractions and expansions "bend" micromotor 80 in the z direction into an "S" shape and generate substantially only bending vibrations in micromotor 80. If only power supply V2 excites micromotor 80, friction nub 90 executes a substantially linear vibratory motion in the z direction, which linear motion is represented by double arrow line 132. By combining longitudinal and bending vibrations, friction nub 90 can be controlled to execute motions in the yz plane similar to motions executed by friction nub 90 in the x-y plane when longitudinal and transverse vibrations are combined as explained in the discussion of FIG. 2B. Some of these motions are represented schematically by ellipses 134, 136 and 138.

It should be noted that while all the connections are shown as hard wired in FIGS. 2A–2D, in preferred embodiments, each electrode is separately connected to a connection box. The box is preferably provided with a plurality of switches and switch modes and the system is provided with a plurality of voltage sources such that any combination of x and z directed motion is achieved.

Other micromotors in accordance with a preferred embodiment of the present invention can be formed from different numbers of layers and different electrode configurations. Furthermore, different layers in a micromotor, in accordance with a preferred embodiment of the present invention can have different thicknesses and be formed from different materials.

Figure 3:
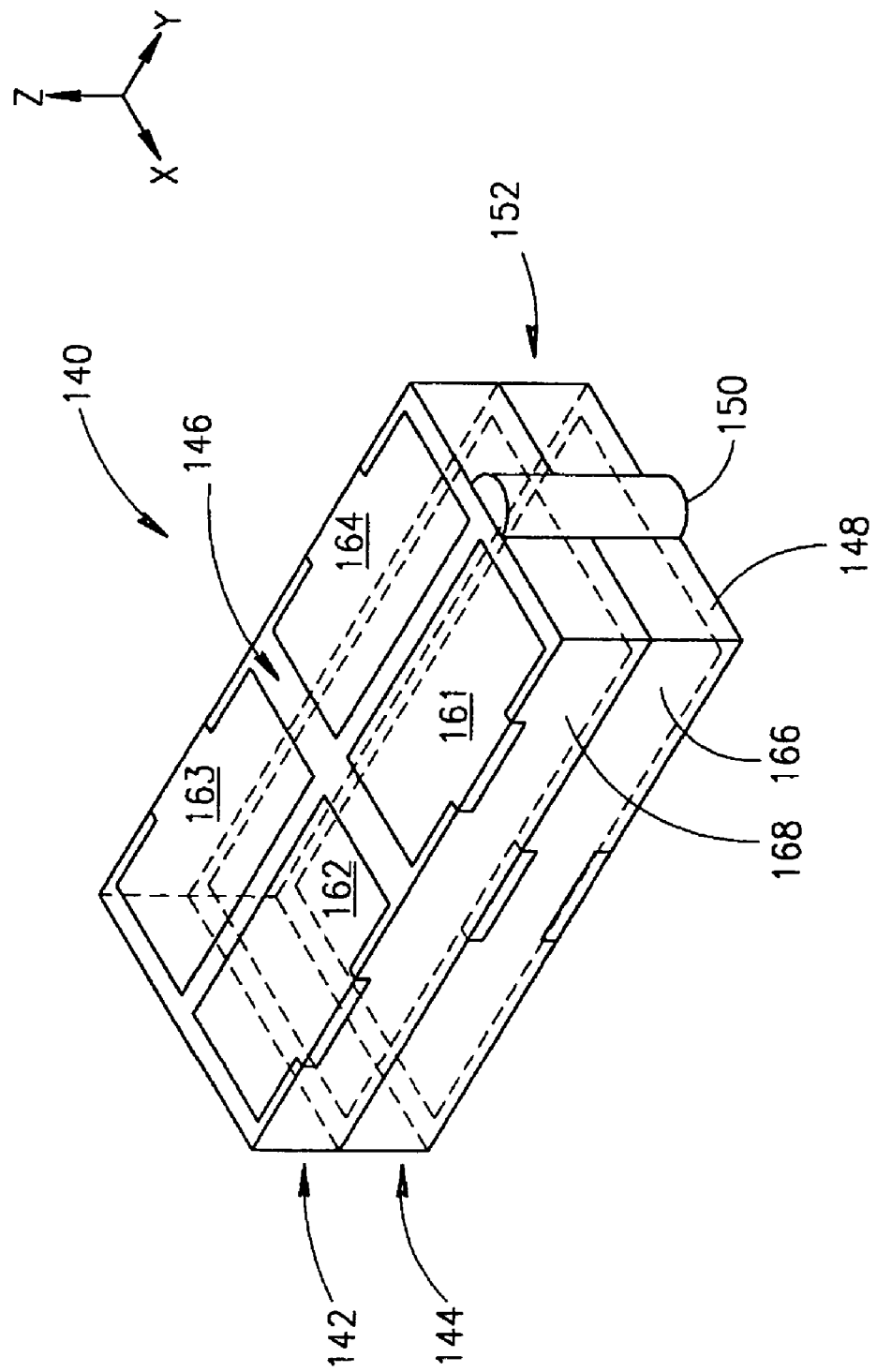
FIG. 3 shows schematically a piezoelectric micromotor in accordance with a preferred embodiment of the present invention, comprising two piezoelectric layers.

For example, FIG. 3 shows a micromotor 140 in accordance with a preferred embodiment of the present invention, formed from two thin rectangular piezoelectric layers 142 and 144. Features of micromotor 140 that are hidden in the perspective of FIG. 3 and that are relevant to a clear discussion of micromotor 140 are shown in ghost lines. Micromotor 140 has relatively large top and bottom face surfaces 146 and 148 respectively and preferably a friction nub 150 located on a short edge surface 152.

Four quadrant electrodes 161, 162, 163 and 164 are preferably located on top surface 146. A single large electrode 166 is preferably located on bottom surface 148. A single large electrode 168 is preferably located between layers 142 and 144.

When exciting vibrations in micromotor 140, preferably, electrode 168 is grounded. AC voltage applied to electrode 166 on bottom surface 148 excites longitudinal vibrations along the y direction in layer 144 and thereby in micromotor 140. Quadrant electrodes are connected diagonally and electrified as explained above to excite transverse vibrations in the x direction in layer 142 and thereby in micromotor 140.

To generate bending vibrations along the z direction in micromotor 140, in accordance with a preferred embodiment of the present invention, electrodes 161 and 164 are electrically connected together and quadrant electrodes 162 and 163 are electrically connected together. Electrode pair 161–164 and electrode pair 162–163 are then electrified with AC voltages 180° out of phase. Bending vibrations are also generated in micromotor 140, in accordance with a preferred embodiment of the present invention, by electrically connecting all quadrant electrodes 161, 162, 163 and 164 together. AC voltages are applied to the connected quadrant electrodes and to electrode 166 so as to cause layer 144 to contract and expand when layer 142 respectively expands and contracts.

Furthermore, while FIGS. 2A–2D and 3 have illustrated only motion in the orthogonal directions, it should be understood that motion in any direction in the x-z plane is also possible. This can be achieved by a number of configurations. One method involves adding an additional piezoelectric plate on the bottom of the configuration of FIG. 3, with a solid electrode facing electrode 148 and quadrant electrodes facing outward from the micromotor. The electrodes shown in FIG. 3 are then configured to cause x-directed motion as described above and the quadrant electrodes on the additional plate are configured to cause z directed motion, also as described above.

The level of excitation of the two sets of quadrant electrodes will then determine the net direction of motion in the x-z plane, with the direction being continuously adjustable from completely in the z-direction to completely in the x direction. It is also possible to attach two of the motors as in FIG. 3 with their faces 148 attached to each other. one of the motors is excited for x directed motion and one is excited for z directed motion. The net result is motion in the x-z plane at a controllable angle by controlling the two excitations.

Methods for accurately controlling motion transmitted to a moveable body by a micromotor have been described for multilayer micromotors in accordance with preferred embodiments of the present invention for which longitudinal and transverse or bending vibrations are independently controllable. Similar methods are applicable to any piezoelectric micromotor, including single layer micromotors, for which longitudinal and transverse or bending vibrations are independently controllable.

Figure 4A:
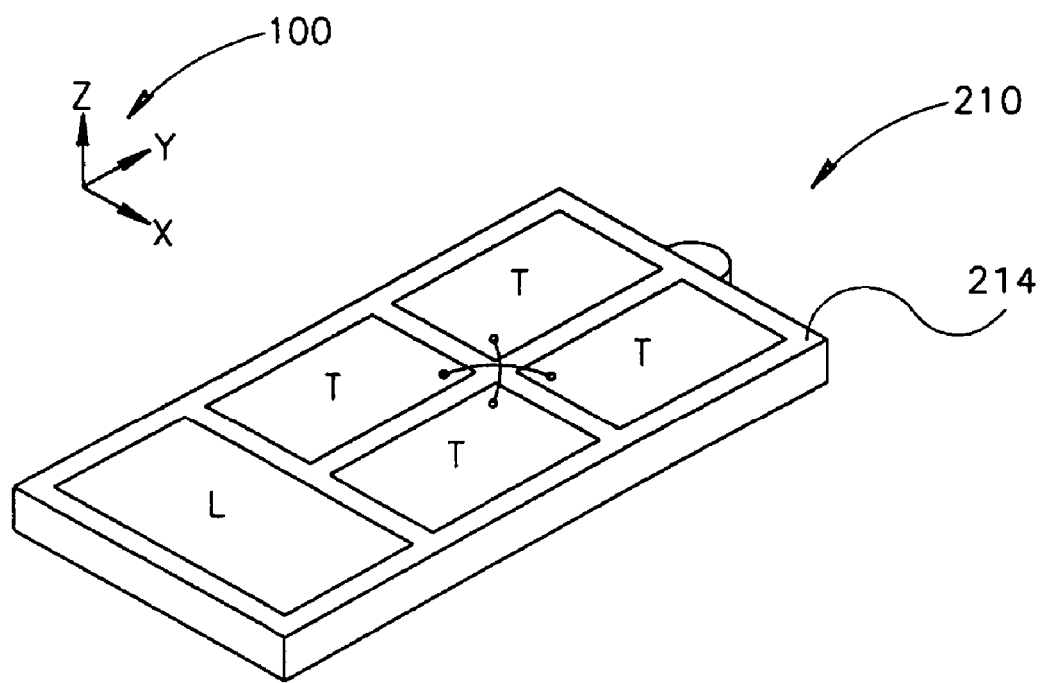
FIGS. 4A and 4B show schematically single layer piezoelectric micromotors that can be controlled to provide fine motor control by controlling longitudinal and transverse vibrations in the micromotors independently of each other, in accordance with a preferred embodiment of the present invention.
Figure 4B:
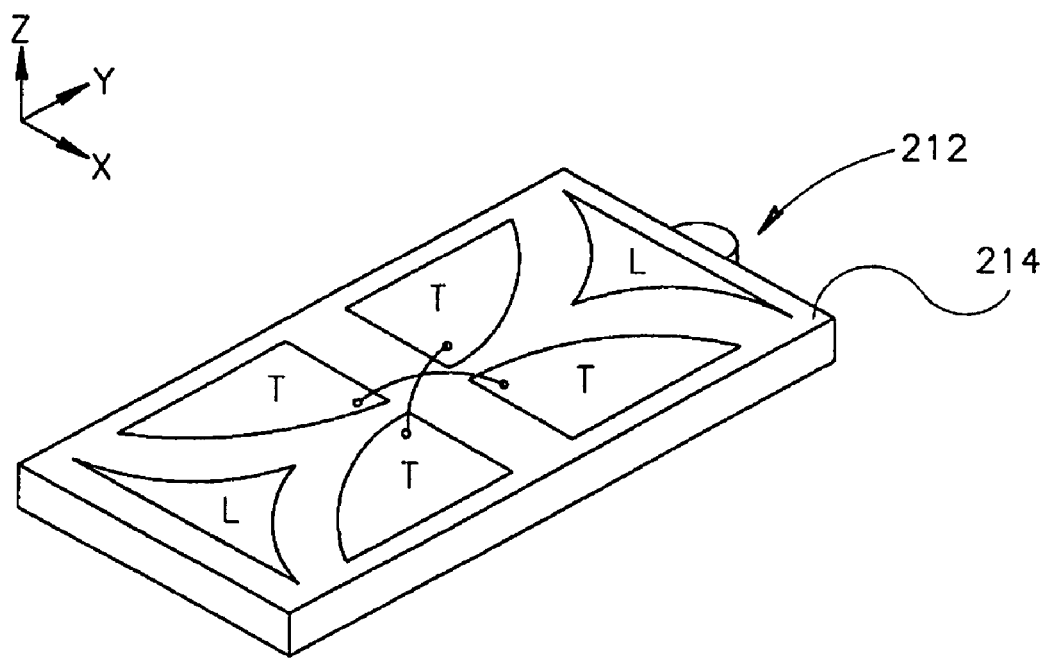

FIGS. 4A and 4B show monoblock micromotors 210 and 212 respectively that are examples of single layer micromotors for which transverse and longitudinal vibrations are independently controllable. These micromotors are shown and described in U.S. Pat. No. 5,616,980 referenced above. Other single layer micromotors that enable independent control of longitudinal and transverse vibrations are known in the art. Directions with respect to the micromotors shown in FIGS. 5A and 5B are referred to coordinate system 100.

Longitudinal vibrations in the micromotor are parallel to the y-axis and transverse vibrations are parallel to the x-axis.

In each of FIGS. 4A and 4B longitudinal vibrations in the micromotor shown are controlled by an electrode or electrodes labeled "L" and transverse vibrations are controlled by electrodes labeled "T". L and T electrodes are located on a first face surface 214 of the micromotors. A second face surface (not shown) parallel to the first face surface has a single large ground electrode (not shown). T electrodes are connected and operated in a "diagonal configuration" to excite transverse vibrations. Fine control of motion transmitted by each of these micromotors can be achieved by controlling amplitudes and phases of longitudinal and transverse vibrations as described above for multilayer micromotors, in accordance with preferred embodiments of the present invention.

Figure 5:
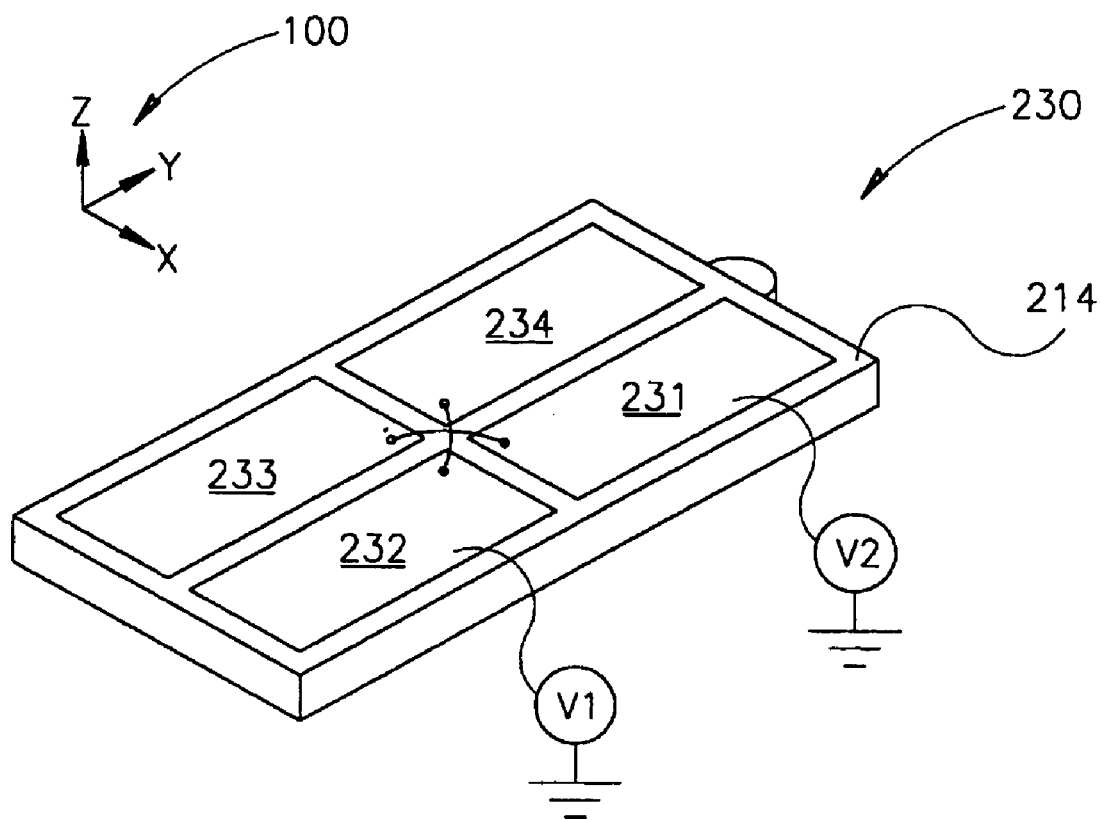
FIG. 5 shows schematically another single layer micromotor that can be controlled to provide fine motion control using a method in accordance with a preferred embodiment of the present invention.

FIG. 5 shows a micromotor 230 described in U.S. Pat. No. 5,616,980 having four quadrant electrodes 231, 232, 233 and 234 located on a first face surface 236 of the micromotor. A second face surface (not shown) parallel to face surface 236 has a large ground electrode (not shown). Directions with respect to micromotor 230 are referred to coordinate system 100.

Micromotor 230 does not have separate electrodes dedicated for controlling only longitudinal or transverse vibrations in the micromotor. However, electrodes in micromotor 230 are electrifiable, in accordance with preferred embodiments of the present invention to provide the fine motion control described above. For example, in a preferred embodiment of the present invention, diagonal electrode pairs 231–233 and 232–234 are independently electrified by voltage sources V1 and V2 respectively. When starting a body, V1 and V2 are preferably operated with their output voltages in phase and equal in magnitude. As a result, only longitudinal vibrations are excited in micromotor 230. Transverse vibrations are excited and their amplitude slowly increased, while the motor continues to vibrate longitudinally, by changing the phase between the output voltages of V1 and V2 and/or by changing the ratio between the output voltages.

In another preferred embodiment of the present invention longitudinal and transverse or bending resonant vibrations in a micromotor are controlled independently to provide fine motion control by the frequency of an AC voltage applied to electrodes in the micromotor. It is well known that generally, excitation curves for resonant longitudinal and transverse or bending vibrations in a piezoelectric micromotor do not overlap completely. As a result it is generally possible to control which resonant vibrations are excited by controlling the frequency of voltage applied to electrodes in the micromotor.

For example, both longitudinal and transverse vibrations in the above described micromotors can be excited by applying an AC voltage to one group of diagonal electrodes and grounding or floating all the other diagonal electrodes. However, the efficiency with which energy is coupled to each of the longitudinal and transverse resonant vibrations is dependent upon the frequency of the applied voltage. For some frequencies, substantially only one or the other of the resonant longitudinal and transverse vibrations will be excited. For other frequencies, both resonant vibrations will be efficiently excited. It is therefore possible to electrify the group of diagonal electrodes at a frequency for which substantially only a resonant longitudinal vibration is excited. A transverse resonant vibration can be then be excited, while energy is still being coupled into the resonant longitudinal vibration, by shifting the frequency of the applied AC voltage to a frequency for which the excitation curves of the longitudinal and transverse resonant vibrations overlap.

In the multilayer micrometers shown in FIGS. 1A–3 all the layers are piezoelectric layers. Multilayer micromotors, in accordance with preferred embodiments of the present invention, that provide fine motion control in two orthogonal directions can be made in which at least one of the layers is a layer formed from a non-piezoelectric material. Characteristics of the non-piezoelectric material can be chosen to provide desirable qualities, such as enhanced mechanical integrity, a desired Q value or particular resonant frequency, in the multilayer motor.

For example, micromotors that have a wear resistant friction nub bonded to a surface region of the micromotor have a tendency to break near to the surface region where the friction nub is bonded. The tendency to breakage is sometimes exacerbated when the friction nub is bonded, in accordance with preferred embodiments of the present invention, to an edge surface of a multilayer micromotor, which edge surface is formed from edge surfaces of a plurality of layers in a multilayer micromotor. Furthermore, producing a strong resilient bond between a friction nub and an edge surface formed by a plurality of aligned edge surfaces of layers in the micromotor can be difficult. By providing a layer in a multilayer micromotor, in accordance with a preferred embodiment of the present invention, that is formed from a wear resistant material such for example steel, an edge surface of the wear resistant layer can function in place of the friction nub. The need to bond a wear resistant friction nub to the micromotor is obviated and the mechanical integrity of the multilayer micromotor will be enhanced. The micromotor will be less susceptible to the breakage to which micromotors having friction nubs are susceptible.

Figure 6:
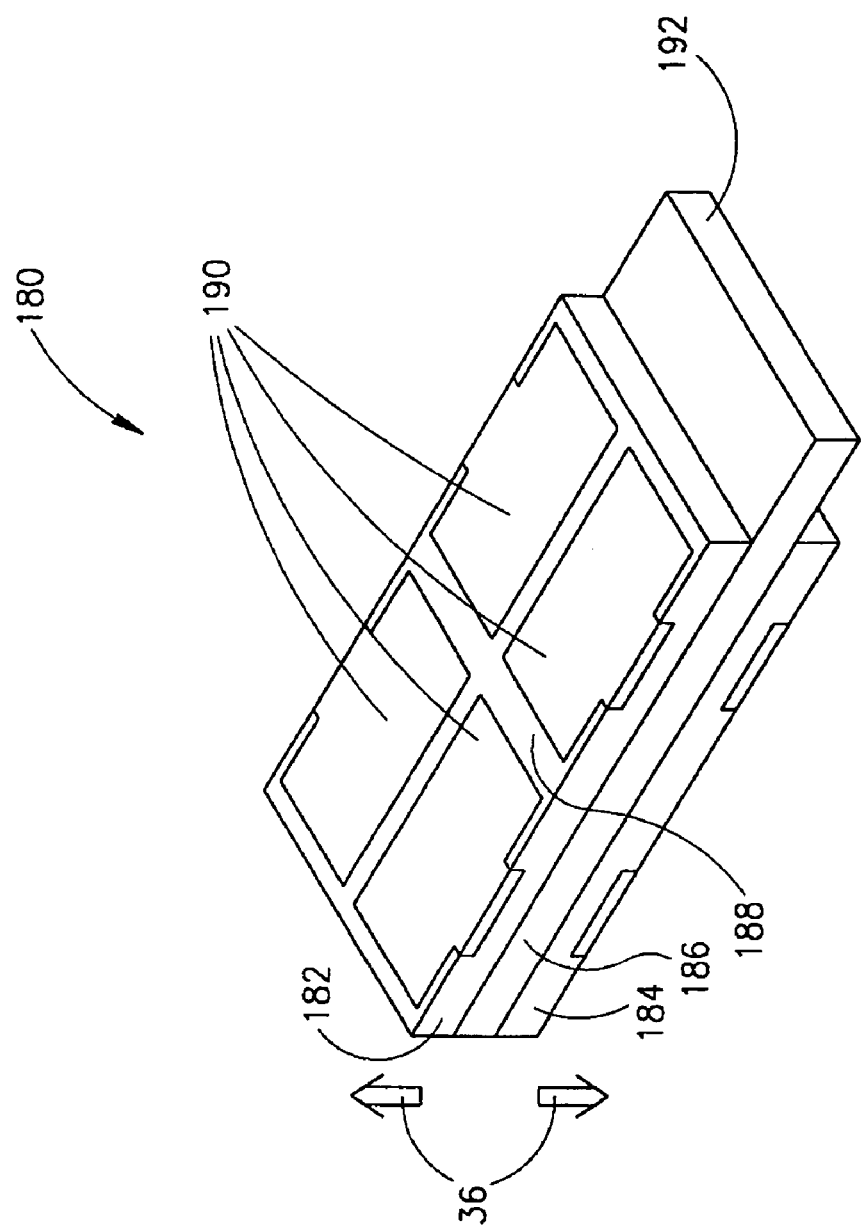
FIG. 6 shows schematically a piezoelectric micromotor in accordance with a preferred embodiment of the present invention, comprising two piezoelectric layers and a layer of non-piezoelectric material.

FIG. 6 shows a piezoelectric micromotor 180 formed from two thin rectangular piezoelectric layers 182 and 184 that sandwich a thin rectangular layer 186 of non-piezoelectric material. Preferably, non-piezoelectric layer 186 has a thickness substantially the same as a thickness of one of piezoelectric layers 182 or 184. Typically, all layers 182, 184 and 186 have a same thickness in a range of thicknesses from 100 microns to about 2 mm. Preferably layers 182 and 184 are polarized in opposite directions perpendicular to their large face surfaces. The direction of polarization of layers 182 and 184 are indicated by double arrows 36.

Piezoelectric layer 182 has a relatively large face surface 188 on which preferably four quadrant electrodes 190 are located. Preferably, piezoelectric layer 184 is a mirror image of piezoelectric layer 182. Preferably non-piezoelectric layer 186 is formed from a wear resistant metal such as steel. Preferably, metal layer 186 is slightly longer than piezoelectric layers 182 and 184 so that at least one short edge surface 192 of metal layer 186 protrudes beyond piezoelectric layers 182 and 184. Metal layer 186 preferably functions as a ground plate.

Longitudinal, transverse and bending vibrations are excited in metallic layer 186 by electrifying quadrant electrodes 190 on piezoelectric plates 182 and 184 using methods discussed above. Energy is transmitted from piezoelectric micromotor 180 to a moveable body by resiliently pressing short edge surface 192 of layer 186 to a surface region of the body.

Whereas piezoelectric micromotor 180 is shown with three layers, one of which is a non-piezoelectric layer, multilayer piezoelectric micromotor can be constructed, in accordance with a preferred embodiment of the present invention, comprising a plurality of thin non-piezoelectric layers interleaved between piezoelectric layers or with a single non-piezoelectric layer and more than two piezoelectric layers.

In the description and claims of the present application, each of the verbs, "comprise" "include" and "has", and conjugates thereof, are used to indicate that the object or objects of the verb are not necessarily a complete listing of components, elements or parts of the subject or subjects of the verb.

The present invention has been described using non-limiting detailed descriptions of preferred embodiments thereof that are provided by way of example and are not intended to limit the scope of the invention. Variations of embodiments described will occur to persons of the art. The scope of the invention is limited only by the following claims.

The invention claimed is:

1. A method for accelerating or decelerating a moveable body which body is moved by urging a piezoelectric micromotor to the body in a first direction so that a contact region of the piezoelectric motor is pressed to the body and exciting vibrations in the piezoelectric micromotor at the contact region in the first direction and in a second direction along a direction of motion of the body, said vibrations having a first amplitude in the first direction and a second amplitude in the second direction, the method comprising:
   a) for acceleration, gradually changing a ratio between the second amplitude relative to the first amplitude from substantially zero to a desired non-zero value; or
   b) for deceleration, gradually changing the ratio between the second amplitude relative to the first amplitude from a non-zero value to substantially zero.

2. A method according to claim 1 wherein said vibrations in said first direction are excited by providing a first electrification to at least some first electrodes on the piezoelectric motor and wherein said vibrations in said second direction are excited by providing electrification to at least some second electrodes on the piezoelectric motor, at least some of which are different from said first electrodes.

3. A method according to claim 2 wherein gradually changing the ratio comprises gradually changing the amplitude of one of the electrifications.

4. A method according to claim 1 wherein first vibrations in the first and second directions are excited by electrifying at least one first electrode on the piezoelectric vibrator and wherein second vibrations in the first and second directions are excited by electrifying at least one second electrode on the piezoelectric vibrator, wherein the phase of the vibrations in the second direction has substantially a 180° phase difference for the first and second vibrations.

5. A method according to claim 4 wherein for accelerating the body, gradually changing the ratio comprises electrifying both said at least one first electrode and said at least one second electrode to cause cancellation of the vibrations in the second direction and gradually reducing electrification of one of the at least one first electrode and at least one second electrode.

6. A method according to claim 4 wherein for decelerating the body, gradually changing the ratio comprises electrifying only one of said at least one first and second electrodes and gradually changing the ratio comprises gradually increasing electrification of the other of the first and second electrodes to cancel vibrations in the second direction.

7. A method according to claim 2 wherein the piezoelectric motor comprises at least one piezoelectric layer and wherein the first and second electrodes are on the same layer.

8. A method according to claim 2 wherein the piezoelectric motor comprises a plurality of piezoelectric layers and wherein the first and second electrodes are on different layers.

9. A method according to claim 1 wherein vibrations in the first direction are excited by applying a voltage to the piezoelectric motor within a first frequency range and wherein vibrations in the second direction are excited by applying a voltage to the piezoelectric motor within a second frequency range which partially overlaps the first frequency range.

10. A method according to claim 9 wherein for accelerating the body gradually changing the ratio comprises applying a voltage at a frequency at which vibrations in substantially only the first direction are excited and changing the frequency of the voltage to a frequency at which both vibrations in the first and second vibrations are excited.

11. A method according to claim 9 wherein for decelerating the body gradually changing the ratio comprises applying a voltage at a frequency at which both vibrations in the first and second directions are excited and changing the frequency of the voltage to a frequency at which vibrations in substantially only the first direction are excited.

* * * * *